United States Patent
Campbell

(10) Patent No.: US 11,102,030 B2
(45) Date of Patent: Aug. 24, 2021

(54) DAISY CHAINING POINT-TO-POINT LINK SENSORS

(71) Applicant: Rockwell Automation Technologies, Inc., Mayfield Heights, OH (US)

(72) Inventor: Alan J. Campbell, Mequon, WI (US)

(73) Assignee: ROCKWELL AUTOMATION TECHNOLOGIES, INC., Mayfield Heights, OH (US)

(*) Notice: Subject to any disclaimer, the term of this patent is extended or adjusted under 35 U.S.C. 154(b) by 86 days.

(21) Appl. No.: 16/455,421

(22) Filed: Jun. 27, 2019

(65) Prior Publication Data
US 2020/0412571 A1    Dec. 31, 2020

(51) Int. Cl.
| | | |
|---|---|---|
| H04W 56/00 | (2009.01) | |
| H04L 12/40 | (2006.01) | |
| G05B 19/4155 | (2006.01) | |
| H03K 3/037 | (2006.01) | |
| H03K 19/20 | (2006.01) | |

(52) U.S. Cl.
CPC .......... H04L 12/40 (2013.01); G05B 19/4155 (2013.01); H03K 3/037 (2013.01); *G05B 2219/31368* (2013.01); *H03K 19/20* (2013.01); *H04L 2012/4026* (2013.01)

(58) Field of Classification Search
CPC . H04L 12/40; H04L 2012/4026; H03K 3/037; H03K 19/20; G05B 19/4155; G05B 2219/31368
USPC ........................................................ 370/257
See application file for complete search history.

(56) References Cited

U.S. PATENT DOCUMENTS

| | | | | |
|---|---|---|---|---|
| 3,565,249 A | * | 2/1971 | Codding | B07C 5/361 209/565 |
| 4,268,856 A | * | 5/1981 | Akazawa | H04N 9/24 348/811 |
| 5,999,848 A | * | 12/1999 | Gord | A61B 5/14865 607/2 |
| 2003/0111969 A1 | * | 6/2003 | Konishi | H05B 41/2881 315/291 |
| 2010/0023657 A1 | * | 1/2010 | Fukuda | G06F 13/161 710/37 |
| 2013/0198428 A1 | | 8/2013 | Kreuzer | |

FOREIGN PATENT DOCUMENTS

WO      2005057796 A2      6/2005

OTHER PUBLICATIONS

European Patent Office, "Extended European Search Report", application No. 20182323.4 EPO, dated Feb. 25, 2021, 12 pages.

* cited by examiner

*Primary Examiner* — Sai Ming Chan

(57) ABSTRACT

Embodiments of this present disclosure may include an industrial control system that uses a daisy chain communication network to couple point-to-point sensors (P2P sensors) for communication of data between respective P2P sensors and a controller. Each P2P sensor may couple to the daisy chain communication network via accessing circuitry. The accessing circuitry may include switching circuitry and flip-flop circuitry to control when each P2P sensors may communicate with the controller via the daisy chain communication network.

20 Claims, 5 Drawing Sheets

DAISY CHAINING POINT-TO-POINT LINK SENSORS

BACKGROUND

This disclosure relates generally to systems and methods for daisy chaining techniques within industrial automation systems. More particularly, embodiments of the present disclosure are directed toward daisy chaining of point-to-point link sensors of the industrial automation systems.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Industrial automation systems may include automation control and monitoring systems. The automation control and monitoring systems may monitor statuses and/or receive information from a wide range of devices, such as valves, electric motors, a wide range of sensors, other suitable monitoring devices, or the like. One or more components of the automation control and monitoring systems, such as programming terminals, automation controllers, input/output (I/O) modules, communication networks, human-machine interface (HMI) terminals, and the like, may use the statuses and/or received information to provide alerts to operators to change or adjust operation of one or more components of the industrial automation system (e.g., such as adjusting operation of one or more actuators), to manage the industrial automation system, or the like.

Generally, the networked devices described above may be associated with information, such as different statuses, sensing data, or the like. The information may relate to an operation of the industrial automation system and may be monitored by the automation control and monitoring systems. Certain communication systems are used to transmit the information to automation control and monitoring systems of the industrial automation systems. For example, each networked device may communicate with the automation control and monitoring systems via wired or wireless communication networks. With this in mind, it may be useful to improve methods for communication between automation control and monitoring systems and networked devices within industrial automation systems.

SUMMARY

A summary of certain embodiments disclosed herein is set forth below. It should be understood that these aspects are presented merely to provide the reader with a brief summary of these certain embodiments and that these aspects are not intended to limit the scope of this present disclosure. Indeed, this present disclosure may encompass a variety of aspects that may not be set forth below.

In one embodiment, a system may include accessing circuitry that couples to a first point-to-point sensor of multiple point-to-point sensors. Each of the point-to-point sensors may couple to each other via respective intermediary accessing circuitry. The accessing circuitry may include flip-flop circuitry and switching circuitry. The system may include a controller coupled to the first point-to-point sensor via the accessing circuitry. The controller may transmit a first clock pulse to the accessing circuitry, where the flip-flop circuitry may reset in response to the accessing circuitry receiving the first clock pulse. The controller may transmit a second clock pulse to the accessing circuitry, where the flip-flop circuitry may set an output to a logic high signal in response to the accessing circuitry receiving the second clock pulse, and where the logic high signal may be used in coupling the first point-to-point sensors to a communication channel via the switching circuitry. The controller may also transmit or receive data via the communication channel during a time interval that corresponds to when the logic high signal is provided to the switching circuitry.

In another embodiment, a device may include switching circuitry for controlling communication between a first point-to-point sensor of a plurality of point-to-point sensors and a controller. The device may also include flip-flop circuitry that outputs a control signal in response to receiving a first combination of inputs. The switching circuitry may only communicatively couple the first point-to-point sensor to a communication channel shared with each of the plurality of point-to-point sensors and the controller in response to receiving the control signal.

In yet another embodiment, a tangible, non-transitory computer-readable medium may store instructions executable by a processor of an electronic device that, when executed by the processor, cause the processor to receive an indication of a request to communicate with a first point-to-point sensor of multiple point-to-point sensors. The point-to-point sensors may couple to each other in a daisy chain network, and each of the point-to-point sensors may communicatively couple to a communication channel via a respective accessing circuit of multiple accessing circuits. The tangible, non-transitory computer-readable medium may also store instructions executable by the processor of the electronic device that, when executed by the processor, cause the processor to transmit a number of clock pulses to a first accessing circuit of the accessing circuits that corresponds to the first point-to-point sensor. The number of clock pulses may include a first number of accessing circuits positioned in the daisy chain network between the controller and the first accessing circuit plus one. The tangible, non-transitory computer-readable medium may also store instructions executable by the processor of the electronic device that, when executed by the processor, cause the processor to communicate data between the first point-to-point sensor and the controller via the communication channel via the first accessing circuit after the number of clock pulses is transmitted to the first accessing circuit.

DRAWINGS

These and other features, aspects, and advantages of the present disclosure will become better understood when the following detailed description is read with reference to the accompanying drawings in which like characters represent like parts throughout the drawings, wherein.

Figure 1:
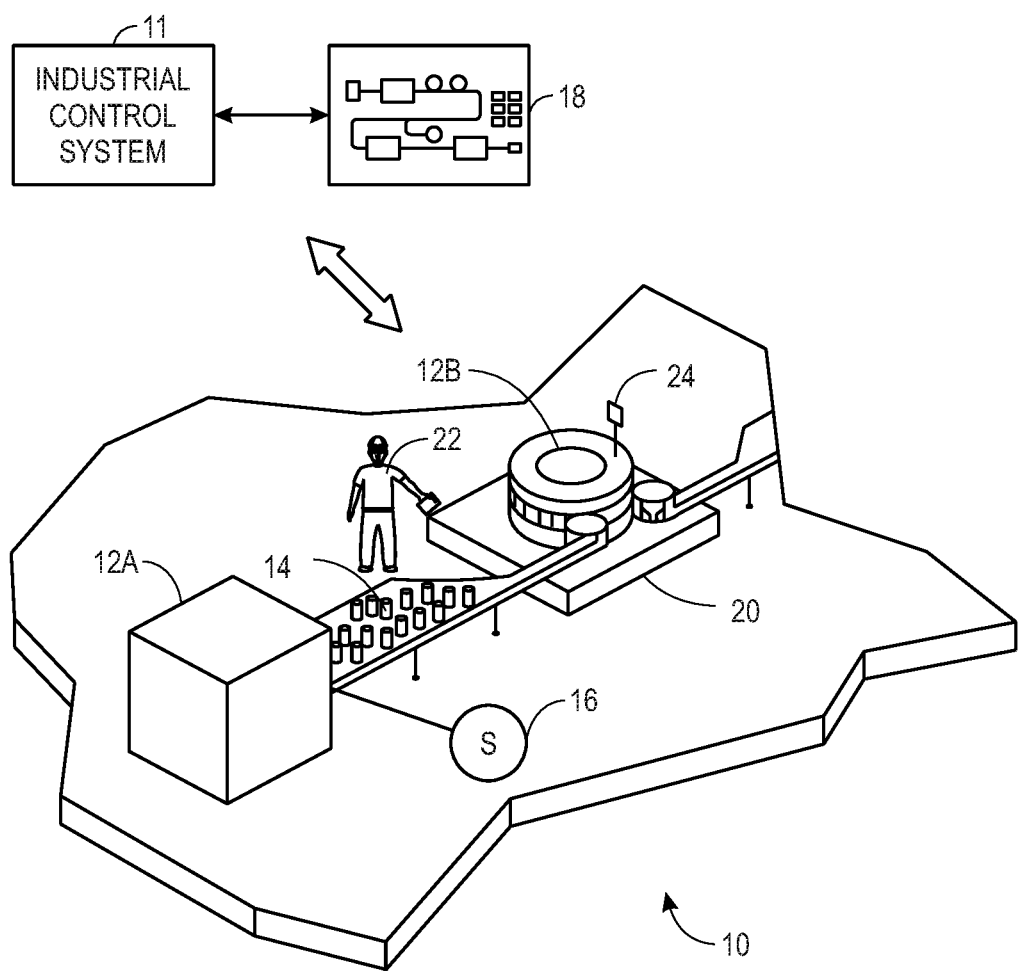
FIG. 1 is a perspective view of an example industrial automation system, in accordance with an embodiment.
Figure 4:
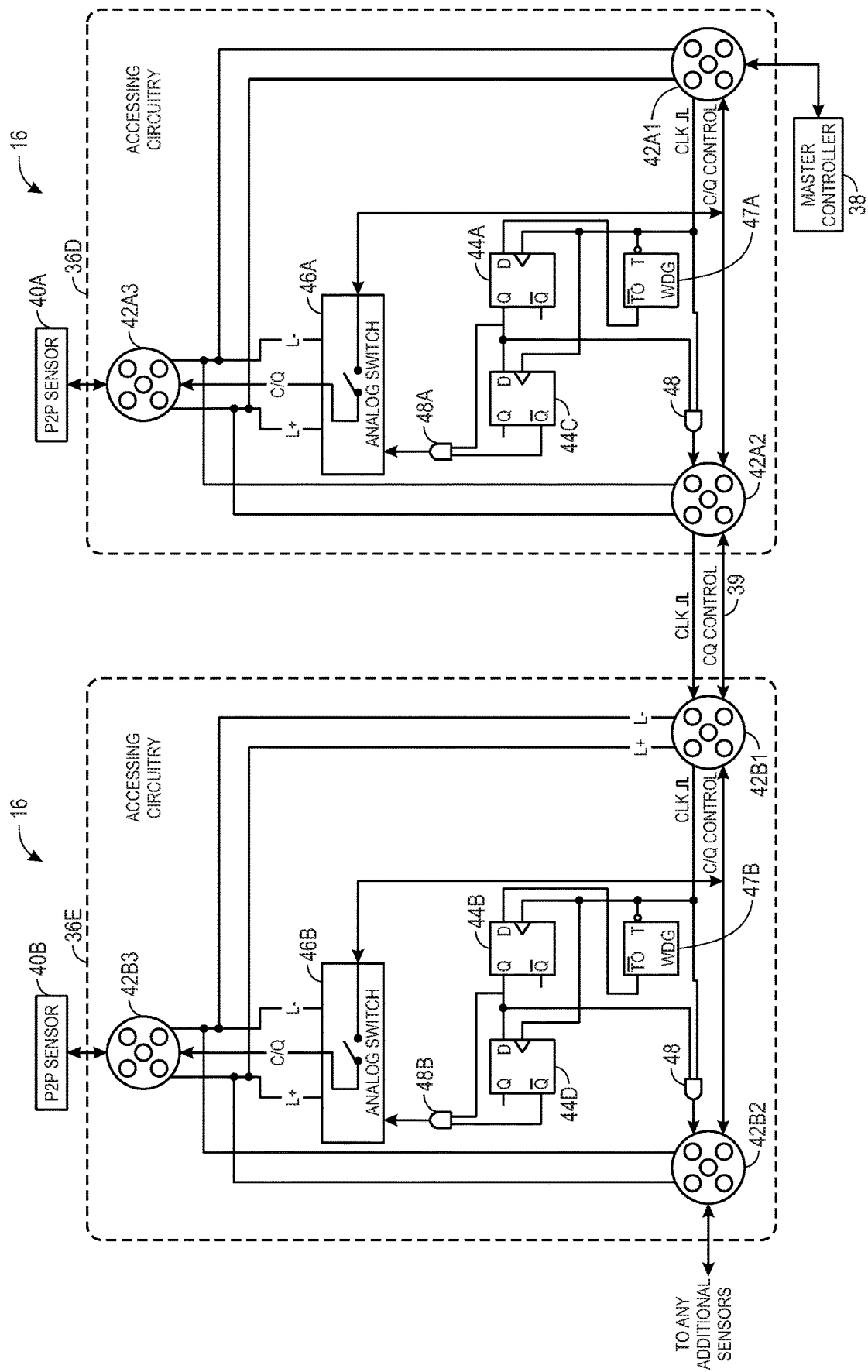
Figure 5:
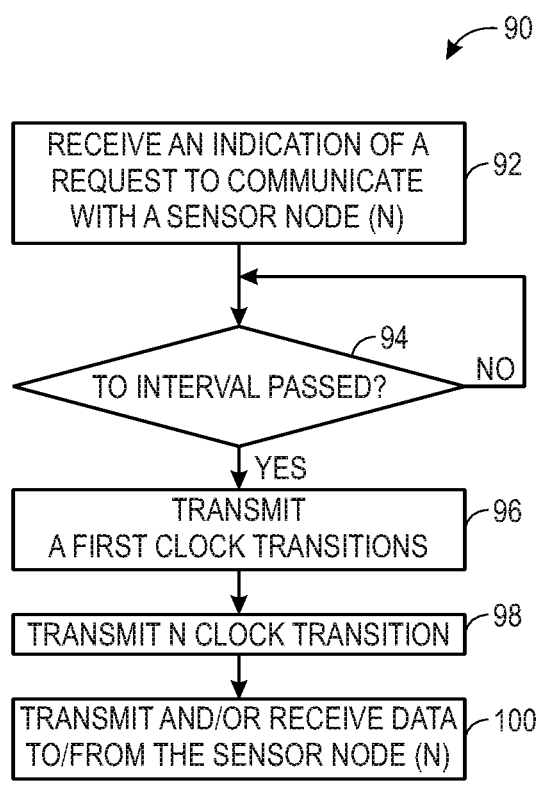

FIG. 4 is a block diagram of another accessing circuitry coupled in a daisy chain network within the industrial automation system of FIG. 1, in accordance with an embodiment; and FIG. 5 is a flowchart of a method for operating the accessing circuitry of FIG. 4 to enable communication between P2P sensors via the daisy chain network within the industrial automation system of FIG. 1, in accordance with an embodiment.

DETAILED DESCRIPTION

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure is generally directed towards systems and methods that enable communicating between point-to-point sensors (P2P sensors) via a daisy chain network. Sensors are generally components that are integral to industrial automation systems. For example, sensing data from a sensor may be leveraged in a diagnostic operation and/or a maintenance operation of a machine or other components of an industrial automation system. In particular, monitoring an operational state of a motor of the industrial automation system may use one or more sensor measurements. Being able to detect the status of temperature, humidity, vibration, and other operational parameters associated with the motor or other components of the industrial automation system may increase an effectiveness of diagnostic and/or maintenance operations, and may improve operation of the industrial automation system overall.

Within the industrial automation system, certain components and/or operation of certain components may benefit from different topologies of sensor networks. For example, rotating machinery operation may achieve relatively more benefit from a wireless sensing network topology than some wired sensing network topologies. Indeed, in a similar way, some components may benefit from P2P sensors communicating via a daisy chain network, where wireless networks may not be practical or feasible. As used herein, "daisy chain," "daisy chained," or "daisy chaining" may refer to a serial or generally sequential wiring of inputs to outputs of sequentially-arranged sensors. Using P2P sensors coupled in a daisy chain network may reduce an amount of wiring used to couple one or more sensors to the industrial control system, in addition to having other performance benefits.

A daisy chain network topology may not currently be a network topology option for certain sensors, such as P2P sensors. For example, P2P sensors may compete to communicate over a shared communication channel, and thus may interrupt communications of other P2P sensors if included in a daisy chain network. As such, in the presently disclosed embodiments, the P2P sensors may be leveraged as part of a bi-directional, digital, and wired network. The network may communicatively couple the P2P sensors and a master controller of the industrial control system via a shared communication channel, such as a network connection coupling the P2P sensors to the industrial control system. However, the shared communication channel may cause challenges when daisy chaining multiple P2P sensors.

When multiple P2P sensors are daisy chained, each of the P2P sensors may communicate through the shared communication channel. The communication from some P2P sensors may interrupt transmissions between the control system and the P2P sensors and/or may make communicating less efficient or effective. Thus, arbitrating access of the P2P sensors to the shared communication channel may improve communication technologies by enabling the P2P sensors to be coupled in a daisy chain network. As described herein, systems and methods that leverage accessing circuitry may be able to daisy chain multiple P2P sensors together. For example, this accessing circuitry (e.g., interconnected logic circuitry) may coordinate access of individual P2P sensors to the shared communication channel, thereby permitting communication between P2P sensors via a daisy chain network.

By using accessing circuitry to daisy chain P2P sensors, costs of implementing and maintaining an industrial control system may be reduced. For example, a star network topology and/or other one-to-one network topologies (e.g., 1:1 coupling) may have a relatively higher cost and/or a chance of maintenance issues due to the increased number of communicative couplings and the increased complexity of the communication network. Communicating between P2P sensors via a daisy chain network may provide a more efficient way to communicate with components of the industrial automation system. Additional benefits from using a daisy chain network topology of the sensors may include a decreased cost of deployment of a sensing system, a decreased complexity of a sensing system, and the like. These decreases in cost and/or complexity may improve efficiency of maintenance operations, improve profitability of operating or maintaining the industrial automation system, and the like.

An example accessing circuitry may include interconnected logic circuitry operable in response to various inputs and outputs, such as a clock signal and a selection signal, to coordinate accesses between the P2P sensors and the communication channel. For example, a master controller of the industrial control system may transmit a clock signal timed to select a P2P sensor. The interconnected logic circuitry may select the P2P sensor in response to the clock signal. After selection of the P2P sensor, the industrial control system may communicate with the P2P sensor until selecting a next P2P sensor. Coupling P2P sensors in this manner may enable any suitable number of P2P sensors to be daisy chained together within the industrial automation system. Additional details with regard to how the logic circuitry may use a clock signal to access one of a plurality of daisy chained P2P sensors will be discussed below with reference to FIGS. 1-5. These systems and methods described herein may also be combined with wireless communication networks to enable daisy chained P2P sensors to communicate wirelessly with the industrial control system, such as via a local networking device wirelessly communicating data between the industrial control system and the daisy chained P2P sensors.

By way of introduction, FIG. 1 is a perspective view of an example industrial automation system 10 that may include daisy chained sensors, as described herein. The industrial automation system 10 may be controlled by an industrial control system 11. In addition, the industrial automation system 10 may include stations having machine components and/or machines to conduct a particular function within an automated process, for example, an automated assembly line. The example automated process of the industrial automation system 10 may begin at a station 12A used for loading objects, such as empty cans or bottles to be filled, into the industrial automation system 10 via a conveyor section 14. The conveyor section 14 may transport the objects to a station 12B to perform a first action, for example, washing the empty cans and/or bottles. As objects exit from the station 12B, the conveyor section 14 may transport the objects to subsequent stations 12 to continue the manufacturing or assembly process. Clearly, for other applications, the particular system, machine components, machines, stations, and/or conveyors may be different or specially adapted to the application. In addition to the equipment described above, the industrial automation system 10 may also include motors, protection devices, switchgear, compressors, and the like.

One or more properties of components of the industrial automation system 10 may be monitored and controlled by an industrial control system 11 for regulating control variables. For example, sensing devices (e.g., sensors 16) may monitor various properties of the industrial automation system 10 and generate outputs used during adjustments of the operation of the industrial automation system 10. Scanners, gauges, valves, flow meters, and the like of the industrial automation system 10 may each generate sensing data used by the industrial control system 11 when determining adjustments to one or more operations of the industrial automation system 10. These adjustments may be managed via control loops. For example, a control loop may include a controller of the industrial automation system 10 associated with a motor drive may receive data regarding a temperature of a connected motor and may adjust operations of the motor drive based on the data.

The industrial control system 11 may be communicatively coupled to a display/operator interface 18 (e.g., a HMI) and to one or more devices of the industrial automation system 10. The industrial control system 11 may represent components of the industrial automation system 10 through visualizations of the components on the display/operator interface 18. The industrial control system 11 may use data transmitted by sensors 16 to update visualizations of the components via changing one or more indications of current operations of the components. These sensors 16 may be any device adapted to provide information regarding process conditions. An operator 22 monitoring the industrial automation system 10 may reference the display/operator interface 18 to determine various statuses, states, and/or current operations or when adjusting operations of the industrial automation system 10 and/or for a particular component.

The industrial control system 11 may use networked devices 24 in managing operation of the industrial control system 11. The networked devices 24 may be any suitable device within the industrial automation system 10 that communicates a status, a data packet, an alert, or the like, to the industrial control system 11 and/or to other networked devices 24. The networked devices 24 may each include processing circuitry coupled to an example sensor 16 that enables transmission of sensing data to the industrial control system 11.

The network of the industrial control system 11 may be a wired network, a wireless network, and/or a combination of the two. Based on the location of the sensors 16, it may be desirable to couple two or more sensors 16 into a daisy chain communication network topology. That is, a collection of sensors 16 may be wired in electrical series with each other and transmit communication packets between each other via the created series circuit. Some sensors 16, such as point-to-point sensors, may use additional components, for example, flip-flop circuitry and/or switching circuitry, when being daisy chained.

Figure 2:
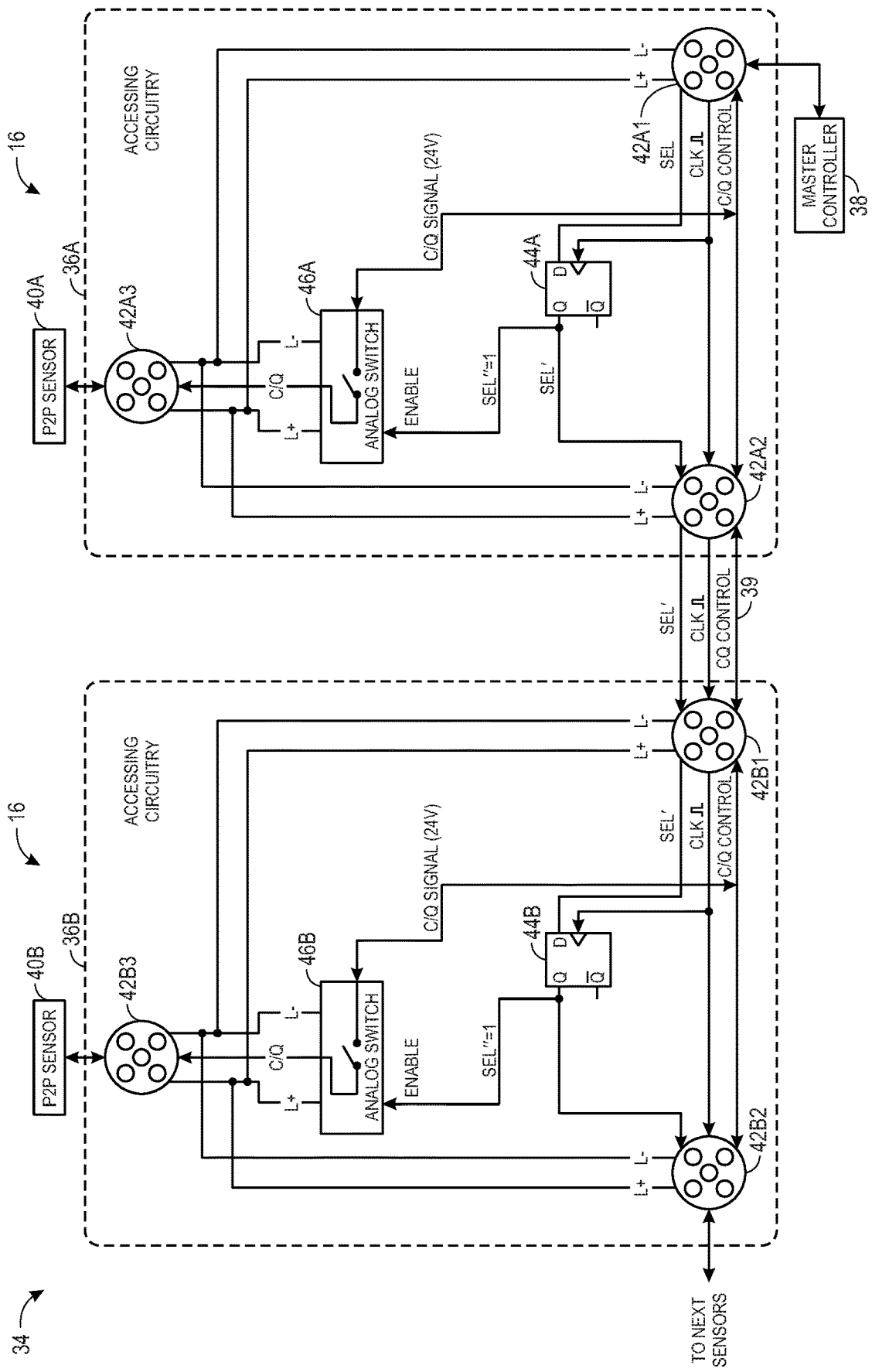
FIG. 2 is a block diagram of accessing circuitry coupled in a daisy chain network within the industrial automation system of FIG. 1, in accordance with an embodiment.

Leveraging a selection clock signal and interconnected logic circuitry may enable communication between point-to-point sensors via a daisy chain network. To help elaborate, FIG. 2 is a block diagram of a first example communication network 34 of the industrial automation system 10 that includes accessing circuitry 36 (36A, 36B). Each of the accessing circuitry 36 are coupled together in series as part of a daisy chain network. The accessing circuitry 36 may couple to a master controller 38, for example, of the industrial control system 11 to each point-to-point sensors (P2P sensors) 40 (40A, 40B) of the daisy chain network. The P2P sensors 40 are example sensors 16 that use additional components when communicating via a daisy chain network.

For example, each P2P sensor 40 may couple to the master controller 38 via logic circuitry and couplers disposed in respective accessing circuitry 36. Each of the accessing circuitry 36 may include, for example, respective multi-pin couplers 42 (42A1, 42A2, 42A3, 42B1, 42B2, 42B3) compatible with P2P sensors 40, such as a M12-5 connector or other suitable field termination connector. By way of example, each multi-pin coupler 42 may operate using a particular number pins (e.g., five pins) including a subset of pins for daisy chaining the P2P sensors 40 and a subset of pins for communicating data between the P2P sensor 40 and the master controller 38. The master controller 38 may transmit a selection signal pulse (SEL) via a first pin and may transmit a clock signal (CLK) via a second pin, where the first pin and the second pin may be the subset of pins for daisy chaining the P2P sensors 40. The selection signal pulse and the clock signal may be used in combination with each other to select a particular P2P sensor 40 of the daisy chain network for communication, such as to retrieve sensing data. The master controller 38 may use a third pin and a fourth pin to supply power (e.g., L+ and L−) to the P2P sensor 40. The master controller 38 may use a fifth pin to transmit a communication signal (C/Q Control) via a shared communication channel 39 used to transmit or receive data to or from the P2P sensor 40 (e.g., to communicate with the P2P sensor 40). The third pin, fourth pin, and fifth pin may be the subset of pins for communicating data between the P2P sensor 40 and the master controller 38. By coupling outputs from a multi-pin coupler 42 (e.g., 42A2) to adjacent multi-pin couplers 42 (e.g., 42B1), the P2P sensors 40 may considered to be daisy chained. To enable the master controller 38 to communication to any particular P2P sensor 40, interconnecting couplings between flip-flop circuitry 44 (44A, 44B) and switching circuitry 46 (46A, 46B) may be used to help coordinate the communication protocol. It should be noted that the flip-flop circuitry 44 and/or the switching circuitry 46 may each be any suitable type of state-preserving device.

By way of example, if the master controller 38 were to establish a communication line with the first P2P sensor 40A, the master controller 38 first may transmit a clock signal having a first clock pulse to the accessing circuitry 36. The first clock pulse (and each subsequent clock pulse) may be received simultaneously by the flip-flop circuitry 44 of each accessing circuitry 36. The first clock pulse resets the accessing circuitry 36 to prepare for selection of a P2P sensor 40. To select the first P2P sensor 40A, the master controller 38 may transmit a second clock pulse to the accessing circuitry 36 simultaneous with a selection signal pulse to the accessing circuitry 36A. Propagation of the selection signal pulse is delayed through the accessing circuitry 36 by one clock cycle. In particular, the selection signal pulse may change the output of the flip-flop circuitry 44A in response to the second clock pulse. When the output of the flip-flop circuitry 44A changes (e.g., SEL'=1), the logical high selection signal is transmitted to both the flip-flop circuitry 44B and to the switching circuitry 46A, permitting access of the P2P sensor 40A to the communication channel 39 of the daisy chain network. It is noted that the master controller 38 uses 2 clock pulses (e.g., n+1) to select the first P2P sensor 40A corresponding to n=1.

The master controller 38 may use three clock pulses to select the second P2P sensor 40A. For example, before the third clock pulse is received by the flip-flop circuitry 44, the selection signal input to the flip-flop circuitry 44A returns to a logical low signal (e.g., SEL=0) to complete transmission of the selection signal pulse input. When the flip-flop circuitry 44 receive the third clock pulse, the flip-flop circuitry 44A changes output in response to the logical low signal of the selection signal input to output a logical low signal. However, since the selection signal pulse is delayed behind the clock pulses, the flip-flop circuitry 44B changes its output in response to the previous selection signal pulse (SEL'=1) input from the flip-flop circuitry 44A circuitry after the second clock pulse. The flip-flop circuitry 44B may change from outputting a logical low signal to outputting a logical high signal of the selection signal pulse, thereby permitting access of the P2P sensor 40B to the communication channel 39 of the daisy chain network. The activation of the accessing circuitry 36B happens at the same time that the deactivation of the accessing circuitry 36A, thus restricting access of the P2P sensor 40A to the communication channel while the P2P sensor 40B is actively accessing the communication channel.

Figure 3:
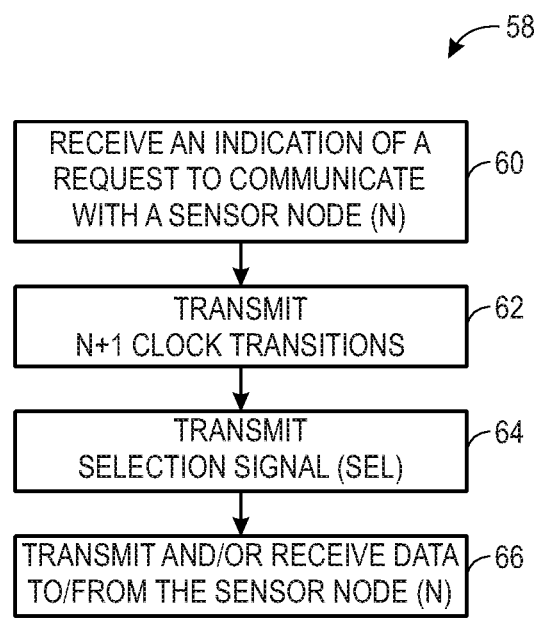
FIG. 3 is a flowchart of a method for operating the accessing circuitry of FIG. 2 to enable communication between point-to-point sensors (P2P sensors) via the daisy chain network within the industrial automation system of FIG. 1, in accordance with an embodiment.

To elaborate further on how the first example communication network 34 operates, FIG. 3 is a flowchart of a method 58 for enabling communication between the P2P sensors 40 and the industrial control system 11 via the communication network 34. For ease of explanation, FIG. 3 is explained using components of FIG. 2. The method 58 may be performed by the master controller 38 to select a respective of the P2P sensors 40, such as during sensing, to retrieve sensing data, or the like. Although the method 58 is described below as being performed by the master controller 38, it should be understood that any suitable control device, such as the industrial control system 11, may perform the method 58. Moreover, although the following description of the method 58 is described in a particular order, it should be understood that the method 58 may be performed in any suitable order.

At block 60, the master controller 38 may receive an indication of a request to communicate with a sensor node (n). Each sensor node may be a different P2P sensor 40. For ease of description, the method 58 is described in terms of accessing circuitry 36A and with a target sensor node of the P2P sensor 40A. The master controller 38 may receive the indication in response to the industrial control system 11 transmitting commands as part of a sensing operation to initiate communication with the P2P sensor 40A.

At block 62, the master controller 38 may transmit n+1 clock pulses (e.g., high-to-low, falling edge, low-to-high, rising edge). The n+1 clock pulses correspond to one more than a numerical position of the P2P sensor 40 relative to the master controller 38. For example, a second position sensor node corresponding to P2P sensor 40B may receive three clock pulses from the master controller 38 when the second P2P sensor 40B is to be selected. The master controller 38 may generate a clock signal having a count of clock pulses equal to one greater than a number corresponding to the sequential position of the P2P sensor 40A, or one greater than the indication of the sensor node (n) to be enabled. In this example, the P2P sensor 40A is the first sensor sequentially coupled to the master controller 38, and thus is to be transmitted a clock signal having two clock pulses (e.g., two rising edges). However, if the master controller 38 were to select the third sequentially coupled P2P sensor 40C (not pictured but presumed as sequentially coupled to P2P sensor 40B), the master controller 38 may transmit a clock signal having four clock pulses.

Referring back to the example of communicating with the second P2P sensor 40C, the first clock signal transition may reset a state of the flip-flop circuitry 44A and the second clock signal transition, when paired with a logical high selection signal, may set a state of the flip-flop circuitry 44A of the accessing circuitry 36A to output a logical high signal.

To communicate with sensor node (n), at block 64, the master controller 38 may transmit a selection signal pulse to multi-pin coupler 42A1. The selection signal pulse may be timed such that the targeted flip-flop circuitry 44 receives a rising clock signal transition at an at least partially overlapping time as when the targeted flip-flop circuitry 44 receives a logical high selection signal pulse. A period of time after the master controller 38 transmits a logical high selection signal, the master controller 38 transmits a logical low selection signal to form a selection signal pulse. The selection signal pulse may permit the P2P sensor 40A to access the communication channel to the master controller 38, when transmitted during a time period that overlaps with the clock signal transmission. When the selection signal pulse is received at the flip-flop circuitry 44 at the same time as a clock pulse of the clock signal, the selection signal pulse is clocked through the flip-flop circuitry 44A to close the switching circuitry 46A. This may be permitted due to the state operation of the flop-flop circuitry 44A. For example, if the flip-flop circuitry 44A included a delay-type flip-flop (e.g., D flip-flop), the following state table, Table 1, may show the expected outputs:

TABLE 1

| SEL (D input) | CLK (Clock input) | SEL' (Q output transmitted as subsequent SEL signal) |
| --- | --- | --- |
| 0 or 1 | falling edge (1 to 0) | no change from previous Q state |
| 0 | rising edge (0 to 1) | reset, so Q outputs 0 |
| 1 | rising edge (0 to 1) | set, so Q outputs 1 |

Having the outputs of the flip-flop circuitry 44A follow behavior of the D-type flip-flop enables the selection signal pulse to propagate through accessing circuitry 36. For example, when both the clock signal input to the flip-flop circuitry 44A and the selection signal pulse to the flip-flop circuitry 44A are transitioned to logical high signals, the selection signal pulse output from the flip-flop circuitry 44A is set to output a logical high signal. But, the selection signal pulse output from the flip-flop circuitry 44A is reset to a logical low signal when the clock signal transitions from a logical low signal to a logical high signal and the selection signal pulse is a logical high signal. This transition pattern causes the state of flip-flop circuitry 44A to reset to a logical low signal and thus output a logical low selection signal pulse output.

When the selection signal pulse and the clock signal overlap, the switching circuitry 46A may receive the high selection signal pulse output signal from the flip-flop circuitry 44A. The switching circuitry 46A may close in response to the high selection signal pulse signal and permit communication signals (C/Q Control) to transmit to the multi-pin coupler 42A3. The multi-pin coupler 42A2 may also receive the selection signal for transmission to the multi-pin coupler 42B1 as a selection signal pulse.

In response to the multi-pin coupler 42A3 receiving the communication signal (C/Q Control), the P2P sensor 40A may communicate with the master controller 38. Thus, at block 66, the master controller 38 may transmit and/or receive data to/from the sensor node (n) (e.g., selected sensor node). For example, the P2P sensor 40B may send sensor data back to the master controller 38 via a path including the multi-pin coupler 42B3, multi-pin coupler 42B1, the multi-pin coupler 42A2, and multi-pin coupler 42A1. It is noted that if the master controller 38 selected the P2P sensor 40B instead of the P2P sensor 40A, the P2P sensor 40B may transmit sensing data to the master controller 38 without interruption from the P2P sensor 40A. In this way, the P2P sensors 40 are successfully daisy chained to the master controller 38.

In some embodiments, the P2P sensor 40A has two operational modes Input-Output (IO) Mode and IO Link Mode. While the P2P sensor 40A is in the IO mode, the P2P sensor 40A is isolated from the communication network 34 and unselected. Applying the communication signal (C/Q Control) for a threshold duration of time that corresponds to a time required to wake up or reconnect the P2P sensor 40A to the communication network 34 may operate the P2P sensor 40A into the IO Link Mode from the IO Mode. For example, a current load for about 70-90 micro-Siemens (µS) of 0.4-0.6 Amperes (A) (e.g., 0.5 A for 80 µS) may enable the P2P sensor 40A to operate into the IO Link Mode for sensing data transmission to the master controller 38. A switch, such as a transistor and/or an analog switch, rated for 0.5 A with relatively low resistance capable of maintaining a margin in a switching voltage thresholds may be included in the switching circuitry 46A to permit operational switching of the P2P sensor 40A.

FIG. 2 and FIG. 3 both describe multi-pin couplers 42 that use two pins for providing the daisy chain topology. In some embodiments, one pin (instead of two pins) may be available for daisy chaining the P2P sensors 40, where remaining pins may be used for communicating via the daisy chain network or in other suitable operations. By including additional logic circuitry, the circuitry of FIG. 2 may be modified to accommodate a daisy chain topology that uses one pin instead of two pins of the multi-pin couplers 42.

To help elaborate, FIG. 4 is a block diagram of a second example communication network 34 of the industrial automation system 10 that includes accessing circuitry 36 (36D, 36E). Each of the accessing circuitry 36 are coupled together via the shared communication channel to provide the daisy chain communication network.

The communication network 34 includes additional flip-flop circuitry 44, watchdog timers 47 (47A, 47B), and logic gates 48 (48A, 48B). These components couple between multi-pin couplers 42 (42A1, 42A2, 42A3, 42B1, 42B2, 42B3) and the P2P sensors 40. In general, the communication network 34 leverages consecutive clock signal transitions and the watchdog timers 47 to daisy chain the P2P sensors 40.

If the master controller 38 were to select the P2P sensor 40A, the basic operation of first example communication network 34 of FIG. 2 may apply. In this way, the master controller 38 may select the P2P sensor 40A using selectively transmitted clock pulses to activate or deactivate the accessing circuitry 36 over time. For example, for the master controller 38 to activate the P2P sensor 40A, the master controller 38 may transmit a first clock pulse to reset the accessing circuitry 36 and start a timing window of watchdog timers 47. During the timing window, the accessing circuitry 36 permits the master controller 38 to select a P2P sensor 40A. While the timing window is active, the master controller 38 may transmit a second clock pulse to flip-flop circuitry 44A to the flip-flop circuitry 44A, while the flip-flop circuitry 44A also receives the logical high signal output from the watchdog timer 47A associated with the timing window. This logical high signal output from the watchdog timer 47A at the rising clock pulse may cause the change in the output from the flip-flop circuitry 44A. In addition, the second clock pulse may also cause the flip-flop circuitry 44B to change an output from the inverted output pin. The output may change from a logical low signal to a logical high signal in response to the second clock pulse. The logic gate 48A may then permit the simultaneous logical high signals to close the switching circuitry 46A, thereby permitting the P2P sensor 40A to access the communication channel coupled to the master controller 38.

In a similar way, if the master controller 38 were to select the second P2P sensor 40B, the master controller 38 may transmit a third clock pulse to the flip-flop circuitry 44. The third clock pulse may cause the flip-flop circuitry 44C to change its inverted output to a logical low signal, disabling the accessing circuitry 36D. The third clock pulse may also cause the flip-flop circuitry 44B to change its output to a logical high signal, similar to the flip-flop circuitry 44A in response to the second clock pulse. Thus, the third clock pulse may activate the accessing circuitry 36E to permit the P2P sensor 40B to access the communication channel and the master controller 38. To deactivate the accessing circuitry 36E, the master controller 38 may transmit a fourth clock pulse. The fourth clock pulse may also activate the next sequentially coupled P2P sensor 40).

To elaborate on how the second example communication network 34 operates, FIG. 5 is a flowchart of a method 90 for enabling communication between the P2P sensors 40 and the industrial control system 11 via the communication network 34. For ease of explanation, FIG. 5 is explained using components of FIG. 4. The method 90 may be performed by the master controller 38 to select a respective one of the P2P sensors 40 for communication of sensing data and/or for ongoing sensing operations. Although the method 90 is described below as being performed by the master controller 38, it should be understood that any suitable control device, such as the industrial control system 11, may perform the method 90. Moreover, although the following description of the method 90 is described in a particular order, it should be understood that the method 90 may be performed in any suitable order.

At block 92, the master controller 38 may receive an indication of a request to communicate with a sensor node (n). Operations performed at block 92 are the same or substantially similar to operations of block 60, and thus are relied upon herein.

In response to receiving the indication of the request, at block 94, the master controller 38 may determine whether a timeout (TO) interval has passed. The TO interval corresponds to a timing window that is initiated in response to a first clock signal (CLK) transition received by the watchdog timers 47. In some embodiments, sensor node selection operations may not overlap and, in this way, the master controller 38 may wait until the TO interval has passed.

When the TO interval has passed, at block 96, the master controller 38 may transmit a first clock pulse. The first clock pulse is used to activate the watchdog timers 47. For ease of description, the watchdog timers 47 are described herein as activating in response to a rising clock signal edge (e.g., logical low to logical high). However, it should be understood that any suitable combination of logic circuitry may be used to implement these techniques, such that a falling edge may activate the watchdog timers 47. When the watchdog timers 47 receive the first clock pulse, a new TO interval begins. The TO interval corresponds to a duration of time that a logical high signal transmits as an input to the flip-flop circuitry 44 from the watchdog timers 47. Each watchdog timer 47 outputs a logical high signal to each flip-flop circuitry 44 generally synchronous or at least partially at a same time. In this way, the flip-flop circuitry 44D receives the logical high signal from the watchdog timer 47B at a same time, or at a substantially similar time, as the flip-flop circuitry 44A receives the logical high signal from the watchdog timer 47A. The watchdog timers 47 may manage a TO interval during which any of the point-to-point sensors may be selected for communication with the controller. When the TO interval begins, the master controller 38 has until the end of the TO interval to select a sensor node and to communicate with the sensor node, such as to receive sensing data from one of the P2P sensors 40.

To communicate with the sensor node (n), at block 98, the master controller 38 may transmit a clock having n clock pulses to multi-pin coupler 42A1. The first clock pulse may disable each P2P sensor 40 and may initiate the watchdog timers 47 (e.g., block 96). Subsequent clock pulses may enable the signal output from the watchdog timers 47 to be clocked through the flip-flop circuitry 44. The flip-flop circuitry 44 may operate according to particular rules based on a type of flip-flop circuitry used. For example, when the flip-flop circuitry 44 includes D-type flip-flops, the flip-flop circuitry 44 may behave according to rules of Table 1. Different flip-flop types may be used with the embodiments described herein and may include additional or alternative circuitry to support its operation. In this way, each adjacent clock pulse may be used as a selection signal to enable communication between the selected P2P sensor 40 and the master controller 38. The switching circuitry 46 may receive a logical high signal resulting from the interconnected flip-flop circuitry 44 and may close in response to receiving the logical high signal. The switching circuitry closing may permit communication between the master controller 38 and the P2P sensor 40. It is noted that the logic gates 48 are depicted as AND gates, however any suitable logic gate may be used to drive selection circuitry to operate as described, including suitable combinations of AND gates, NAND gates, OR gates, NOR gates, XOR gates, inverting gates, or the like.

Generally, the second clock pulse (e.g., sequential to the first clock pulse of block 96) begins communication between the master controller 38 and the P2P sensor 40A. This may cause the output of the first watchdog timer 47A to transmit from the flip-flop circuitry 44A to the flip-flop circuitry 44B. If a third clock pulse were included with the clock signal, the first sensor node may disable in response to the third clock pulse and pass the clock signal onto the second sensor node corresponding to P2P sensor 40B. This may set the flip-flop circuitry 44B, resulting in the output of a logical high signal. While each subsequent sensor node is enabled, the master controller 38 may communicate with the P2P sensor 40 using the communication signal (C/Q Control).

At block 100, the master controller 38 may communicate with the sensor node (n) via the communication signal (C/Q Control). Data transmission between the P2P sensor 40 and the master controller 38 may continue until the watchdog timer 47 expires or until the communication signal (C/Q Control) is disabled. When either of those signals transitions to logical low, communication stops between the master controller 38 and the selected P2P sensor 40.

For example, if the master controller 38 were to receive an indication selecting P2P sensor 40B, the master controller 38 may wait for a current selection operation to end. When the TO interval ends, the master controller 38 may transmit a first clock pulse to each watchdog timer 47 via the clock signal to start a new TO interval and/or to disable each sensor node. While the new TO interval is ongoing, the master controller 38 may transmit two additional, sequential clock pulses to select the n=2 P2P sensor 40B. While the P2P sensor 40B is selected, the master controller 38 may communicate with the P2P sensor 40B without interruption by data from the P2P sensor 40A or from other P2P sensors 40. The master controller 38 may continue communication with the P2P sensor 40B until the TO interval ends or until the master controller 38 ends communication itself.

In each of these described examples, the master controller 38 may be replaced or provided in conjunction with wireless gateway circuitry to wirelessly communicate with the industrial control system 11. For these cases, the wireless gateway circuitry may include transceiver circuitry, transmitting circuitry, receiving circuitry, or the like. Any suitable type of wireless communication may be performed in combination with at least some of the techniques described above. In addition, certain encryption techniques may be used to secure data transmitted between the wireless gateway circuitry and the industrial control system 11.

Thus, technical effects of the present disclosure include techniques for coupling point-to-point sensors in a daisy chain network topology. In this way, a two or more point-to-point sensors may be sequentially coupled together (e.g., daisy chained) and able to communicate with a master controller of an industrial control system without interference from other point-to-point sensors coupled in the daisy chain network. In this way, a point-to-point sensor may perform sensing operations, or otherwise generate information, to be transmitted to the industrial control system. In response at least to the master controller using a selection clock signal to select the point-to-point sensor, the point-to-point sensor and the master controller may communicate freely while the point-to-point sensor is selected. In some industrial automation systems, it may be advantageous to daisy chain sensors together. For example, communicating between point-to-point sensors via a daisy chain network may reduce maintenance costs and/or may reduce installation costs. By including additional circuitry and leveraging the selection clock signal, the master controller may selectively communicate with point-to-point sensors.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

What is claimed is:

1. A system, comprising:
    a plurality of accessing circuitries, each accessing circuitry configured to couple to a respective point-to-point sensor of a plurality of point-to-point sensors, wherein the plurality of point-to-point sensors are coupled in series via respective accessing circuitries, and wherein each accessing circuitry comprises flip-flop circuitry and switching circuitry; and
    a controller coupled to the plurality of accessing circuitries, wherein the controller is configured to communicate with a point-to-point sensor N that has a position N within the series of point-to-point sensors by:
        transmitting N+1 clock pulses to each of the plurality of accessing circuitries, wherein the flip-flop circuitry of each accessing circuitry is configured to reset in response to a first clock pulse of the N+1 clock pulses;
        transmitting a selection signal pulse to accessing circuitry N that is coupled to the point-to-point sensor N at a first timing that at least partially overlaps with a second timing at which the N+1 clock pulse arrives at the accessing circuitry N, wherein the flip-flop circuitry N of the accessing circuitry N is configured to set an output to a logic high signal in response to the overlapped clock pulse and selection signal pulse, and transmit the logic high signal to the switching circuitry N of the accessing circuitry N, and wherein the switching circuitry N is configured to enable communication between the point-to-point sensor N and the controller in response to the logic high signal.

2. The system of claim 1, wherein the controller is configured to transmit the N+1 clock pulses sequentially as part of a clock signal transmission.

3. The system of claim 2, wherein the logic high signal causes the switching circuitry N to close to enable the communication between the point-to-point sensor N and the controller.

4. The system of claim 1, wherein the controller is configured to transmit communication signals to the plurality of point-to-point sensors via a shared communication channel.

5. The system of claim 4, wherein the switching circuitry is configured to enable communication between the point-to-point sensor N and the controller by coupling the point-to-point sensor N to the shared communication channel in response to the logic high signal.

6. The system of claim 5, wherein each switching circuitry is configured to couple between a respective flip-flop circuitry and a respective point-to-point sensor, and to an output of a respective flip-flop circuitry, and wherein each switching circuitry is configured to facilitate communication between the respective point-to-point sensor and the controller in response to receiving a reverse output of the respective flip-flop circuitry.

7. The system of claim 6, wherein each switching circuitry is configured to operate according to a rating between 0.4 Amperes (A) and 0.6 A, and wherein each switching circuitry is configured to change a state to permit communication between a respective point-to-point sensor and the controller when the switching circuitry receives a control signal exceeding the rating.

8. A tangible, non-transitory computer-readable medium configured to store instructions executable by a processor of an electronic device that, when executed by the processor, cause the processor to:
    receive an indication of a request to communicate with a first point-to-point sensor of a plurality of point-to-point sensors, wherein the plurality of point-to-point sensors are coupled to each other in a daisy chain network, and wherein each of the plurality of point-to-point sensors is configured to communicatively couple to a communication channel via a respective accessing circuit of a plurality of accessing circuits;
    transmit a number of clock pulses to a first accessing circuit of the plurality of accessing circuits that corresponds to the first point-to-point sensor, wherein the number of clock pulses comprises a first number of accessing circuits positioned in the daisy chain network between a controller and the first accessing circuit plus one; and
    communicate data between the first point-to-point sensor and the controller via the communication channel via the first accessing circuit after the number of clock pulses is transmitted to the first accessing circuit.

9. The tangible, non-transitory computer-readable medium of claim 8 storing instructions that, when executed by the processor, cause the processor to:
    transmit a first clock pulse of the number of clock pulses to each of the plurality of accessing circuits, wherein the first clock pulse initializes the each accessing circuit; and
    transmit a second clock pulse of the number of clock pulses, wherein the second clock pulse causes flip-flop circuitry to output a logic high signal, causing the first accessing circuit to communicatively couple with the communication channel.

10. The tangible, non-transitory computer-readable medium of claim 9 storing instructions that, when executed by the processor, cause the processor to:
    transmit a third clock pulse of the number of clock pulses, wherein the second clock pulse causes the flip-flop circuitry to output a logic low signal, causing the first accessing circuit to communicatively decouple with the communication channel while causing a second accessing circuit to communicatively couple with the communication channel.

11. The tangible, non-transitory computer-readable medium of claim 8 storing instructions that, when executed by the processor, cause the processor to:
    communicate the data between the controller and the plurality of point-to-point sensors until a watchdog timer interval expires, wherein a first clock pulse of the number of clock pulses initially started the watchdog timer interval.

12. The tangible, non-transitory computer-readable medium of claim 8 storing instructions that, when executed by the processor, cause the processor to:
    communicate the data between the controller and the plurality of point-to-point sensors until a selection signal pulse is transmitted through each of the plurality of accessing circuits.

13. The tangible, non-transitory computer-readable medium of claim 8 storing instructions that, when executed by the processor, cause the processor to:
  communicate the data between the first point-to-point sensor for a duration of time corresponding to a first clock pulse of the number of clock pulses; and
  communicate the data between a second point-to-point sensor of the plurality of point-to-point sensors for the duration of time corresponding to a second clock pulse of the number of clock pulses, wherein the second clock pulse and the first clock pulse are sequentially transmitted as part of a clock signal transmission.

14. The tangible, non-transitory computer-readable medium of claim 8 storing instructions that, when executed by the processor, cause the processor to:
  transmit a second clock pulse of the number of clock pulses and a selection signal pulse to the first accessing circuit simultaneously, wherein the second clock pulse and the selection signal pulse cause flip-flop circuitry to output a logic high signal, causing the first accessing circuit to communicatively couple with the communication channel.

15. A control system for controlling communication with a plurality of point-to-point sensors in a daisy chain network, wherein each of the plurality of point-to-point sensors is coupled to a respective accessing circuitry of a series of accessing circuitries, the control system configured to:
  receive an indication of a request to communicate with a point-to-point sensor N that has a position N within the plurality of point-to-point sensors;
  transmit N+1 clock pulses sequentially to each of the plurality of accessing circuitries; and
  transmit a selection signal pulse to accessing circuitry N that is coupled to the point-to-point sensor N at a first timing that at least partially overlaps with a second timing at which the N+1 clock pulse arrives at the accessing circuitry N.

16. The control system of claim 15, wherein each accessing circuitry comprises flip-flop circuitry and switching circuitry.

17. The control system of claim 16, wherein a first clock pulse of the N+1 clock pulses causes flip-flop circuitry of each accessing circuitry to reset.

18. The control system of claim 16, further configured to cause flip-flop circuitry N of the accessing circuitry N to set an output to a logic high signal by transmitting the overlapped clock pulse and selection signal pulse to the flip-flop circuitry N.

19. The control system of claim 18, wherein the flip-flop circuitry N transmits the logic high signal to switching circuitry N of the accessing circuitry N.

20. The control system of claim 19, wherein the logic high signal causes the switching circuitry N to close to enable communication between the point-to-point sensor N and the control system.

* * * * *